United States Patent
Towns et al.

(10) Patent No.: US 6,551,727 B2
(45) Date of Patent: *Apr. 22, 2003

(54) ELECTROLUMINESCENT DEVICE

(75) Inventors: Carl Robert Towns, Stanstead (GB); Stephen Karl Heeks, Cottenham (GB); Julian Charles Carter, Chesterton (GB)

(73) Assignee: Cambridge Display Technology Limited (GB)

( * ) Notice: Subject to any disclaimer, the term of this patent is extended or adjusted under 35 U.S.C. 154(b) by 0 days.

This patent is subject to a terminal disclaimer.

(21) Appl. No.: 09/976,319

(22) Filed: Oct. 15, 2001

(65) Prior Publication Data

US 2002/0011779 A1 Jan. 31, 2002

Related U.S. Application Data

(63) Continuation of application No. 09/143,100, filed on Aug. 28, 1998, now Pat. No. 6,416,885.

(30) Foreign Application Priority Data

Aug. 29, 1997 (GB) .............................................. 9718393

(51) Int. Cl.$^7$ ......................... B32B 19/00; B32B 27/14; B32B 3/00; B32B 15/00
(52) U.S. Cl. ...................... 428/690; 428/195; 428/201; 428/209
(58) Field of Search ............................. 257/40, 99, 88, 257/79, 103, 113; 428/690, 195, 917, 201, 209; 313/504, 505, 506

(56) References Cited

U.S. PATENT DOCUMENTS 5,399,936 A    3/1995   Namiki et al. .............. 313/504
5,798,170 A    8/1998   Zhang et al. ................ 428/212
6,416,885 B1 *  9/2002   Towns et al. ................ 428/690

FOREIGN PATENT DOCUMENTS

| EP | 0549345 A2 | 6/1993 |
| EP | 0686662 A3 | 12/1995 |
| WO | WO 90/13148 | 11/1990 |
| WO | WO 95/24056 | 9/1995 |
| WO | WO 96/08047 | 3/1996 |
| WO | WO 96/26830 | 9/1996 |
| WO | WO 96/31909 | 10/1996 |
| WO | WO 97/32452 | 9/1997 |

OTHER PUBLICATIONS

Bayer Product Information, Trial Product A–14071, Polyethylene Dioxythiophene Polystyrene Sulphonate (PEDT/PSS), Sep. 1995.

* cited by examiner

Primary Examiner—Kenneth R. Horlick
Assistant Examiner—Christine Maupin
(74) Attorney, Agent, or Firm—Finnegan, Henderson, Farabow, Garrett & Dunner

(57) ABSTRACT

An electroluminescent device comprising: a first charge-carrier injecting layer for injecting positive charge carriers and a second charge-carrier injecting layer for injecting negative charge carriers, at least one of the charge-carrier injecting layers being patterned so as to comprise spaced-apart charge-injecting regions; an organic light-emitting layer located between the first and second charge-carrier injecting layers; and an unpatterned conductive polymer layer located between the organic light-emitting layer and the patterned charge-carrier injecting layer, the resistivity of the conductive polymer layer being sufficiently low to allow charge carriers to flow through it from the charge-injecting regions to generate light in the organic light-emitting layer but sufficiently high to resist lateral spreading of charge carriers beyond the charge-injecting regions.

16 Claims, 1 Drawing Sheet

ELECTROLUMINESCENT DEVICE

This is a continuation of application Ser. No. 09/143,100 filed Aug. 28, 1998 U.S. Pat. No. 6,416,885 and also claims priority on Great Britain Application No. GB 9718393.3 which was filed Aug. 29, 1997, all of which are incorporated herein by reference.

BACKGROUND OF THE INVENTION

This invention relates to electroluminescent devices, especially ones that have, a conjugated polymer as a light-emitting layer.

One type of electroluminescent device is described in PCT/WO90/13148, the contents of which are incorporated herein by reference. The basic structure of this device is a light-emitting polymer film (for instance a film of a poly(p-phenylenevinylene)—"PPV") sandwiched between two electrodes, one of which injects electrons and the other of which injects holes. It is believed that the electrons and holes excite the polymer film, emitting photons. These devices are useful as flat panel displays, in which case one of the electrodes is transparent—for example being made of indium-tin oxide ("ITO").

One refinement of the device is that to allow the device to display information one of the electrodes can be patterned so that it only injects charge carriers over part of its area. The electrode can be patterned into discrete areas which can be controlled independently and each inject charge carriers into a respective discrete pixel of the polymer film.

Another refinement is that it has been found that the turn-on voltage, the brightness of the device at low voltage, the efficiency, the lifetime and the stability of the device can sometimes be improved by adding a layer of conductive polymer between the light-emitting film and one of the electrodes. In order to achieve these benefits these conductive polymer layers typically have a sheet resistance less than $10^6$ Ohms/square (i.e. a sheet resistance less than $10^6$ Ohms/square), the conductivity being controllable by doping of the polymer layer. One example of a suitable conductive polymer is polystyrene sulphonic acid doped polyethylene dioxythiophene ("PEDT-PSS")—see EP 0,686, 662. For reasons which are discussed in more detail below, it is, however, difficult to produce good devices with an intermediate conductive polymer layer.

There have been some devices which could be regarded as a hybrid of these refinements. For instance, U.S. Pat. No. 5,399,936 discloses a device in which the patterned electrode is covered by a hole-transporting/injecting organic layer of diphenyl-N-N'-bis(3-methylphenyl)-1,1'-biphenyl-4,4'-diamine ("TPD"). However, the TPD is a small molecule, not a polymer, and it is undoped. WO 96/08047 discloses a device in which a conductive polymer layer is patterned to provide insulative regions and conductive regions to pixellate the display.

SUMMARY OF THE INVENTION

According to the present invention there is provided an electroluminescent device comprising: a first charge-carrier injecting layer for injecting positive charge carriers and a second charge-carrier injecting layer for injecting negative charge carriers, at least one of the charge-carrier injecting layers being patterned so as to comprise spaced-apart charge-injecting regions; an organic light-emitting layer located between the first and second charge-carrier injecting layers; and an unpatterned conductive polymer layer located between the organic light-emitting layer and the patterned charge-carrier injecting layer, the resistivity of the conductive polymer layer being sufficiently low to allow charge carriers to flow through it from the charge-injecting regions to generate light in the organic light-emitting layer but sufficiently high to resist lateral spreading of charge carriers beyond the charge-injecting regions.

The patterned charge injecting layer could be an anode or a cathode. The other charge injecting layer (of opposite polarity) may be patterned or unpatterned. The width of the charge injecting regions is suitably less than 1 mm, 300 $\mu$m or 100 $\mu$m, preferably less than 50 $\mu$m and most preferably less than or around 20 $\mu$m. The spacing between the charge injecting regions is suitably less than 1 mm, 300 $\mu$m or 100 $\mu$m, preferably less than 50 $\mu$m and most preferably less than or around 20 $\mu$m.

The cathode is preferably a sputtered cathode. The cathode is preferably a low work function cathode. The cathode may be patterned by dry etching.

The light-emitting layer preferably is or comprises a semiconductive conjugated polymer such as PPV. The light-emitting layer suitably is or comprises PPV, poly(2-methoxy-5(2'-ethyl)hexyloxyphenylene-vinylene) ("MEH-PPV"), a PPV-derivative (e.g. a di-alkoxy derivative), a polyfluorene and/or a co-polymer incorporating polyfluorene segments, PPVs and/or related co-polymers. It could be deposited by spin-coating, dip-coating, blade-coating, meniscus-coating, self-assembly etc. The constituent of the light-emitting layer and/or its precursor is suitably water-based: examples are precursor-based PP.Vs. The thickness of the light-emitting layer is preferably in the range from 20 to 200 nm and most preferably around 100 nm.

The term "conjugated" indicates a polymer for which the main chain is either fully conjugated, possessing extended pi molecular orbitals along the length of the chain, or is substantially conjugated, but with interruptions to conjugation at various positions, either random or regular, along the main chain. It includes within its scope homopolymers and copolymers.

The conductive polymer layer preferably is or comprises polyethylene dioxythiophene ("PEDT"), polystyrene sulphonic acid doped polyethylene dioxythiophene ("PEDT-PSS"), doped polyaniline, a doped alkylthiophene and/or a doped polypyrrole. The thickness of the layer is suitably less than 200 nm, preferably less than 100 nm and most preferably less than or around 50 nm. The sheet resistance of the layer is suitably greater than $10^6$ or $10^7$ Ohms/square, preferably greater than $10^8$ Ohms/square and most preferably greater than or around $10^{10}$ Ohms/square.

The conductivity of the conductive polymer layer is preferably adjustable (e.g. by means of additive components) over a relatively wide range. The conductive polymer is preferably doped with one or more components that influences its conductivity (e.g. polystyrene sulphonic acid ("PSS") or epoxy-silane). The conductive polymer is suitable polyaniline, polypyrrole or a poly-thiophene.

The conductive polymer is preferably adapted to reduce its solubility and/or its interection with an adjacent layer, especially a polymer layer. This layer is preferably the subsequent layer and most preferably the light emitting layer. To achieve this the conductive polymer preferably contains an additional component. This component is suitably a cross-linking agent (e.g. epoxy-silane). This component preferably does not significantly impair the performance of the device, especially by increasing the drive voltage significantly, reducing the emission uniformity significantly or reducing the efficiency significantly. This component is especially advantageous in a device in which the conductive polymer and the light-emitting layer have the same or similar solvents. The amount of this component in the conductive polymer layer is suitably greater than 50 wt %, preferably between 50 wt % and 200 wt % and most preferably around 100 wt %.

Where the conductive polymer is PEDT-PSS the dilution of the PEDT-PSS with the PSS is preferably greater than 20% and most preferably greater than 50%. Any of these proportions may be used together with any of the proportions of epoxy-silane disclosed above.

The resistance of the conductive polymer layer is suitably such as to require an increase in the drive voltage of the device (compared to when the layer is absent) of 0.5V or less (preferably 0.2V or less) for equivalent device performance.

DESCRIPTION OF THE DRAWINGS

The present invention will now be described by way of example with reference to the accompanying drawings, in which.

DESCRIPTION OF PREFERRED EMBODIMENT

Figure 1:
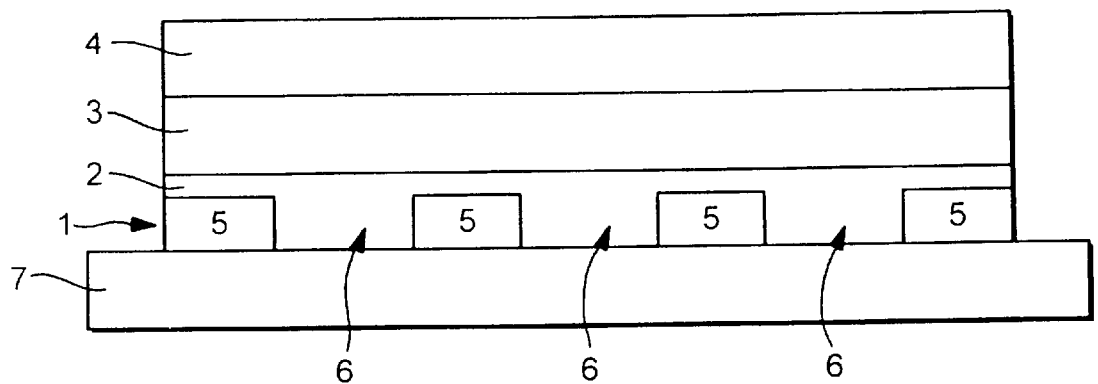
FIG. 1 shows a cross-section of an electroluminescent device.
Figure 2:
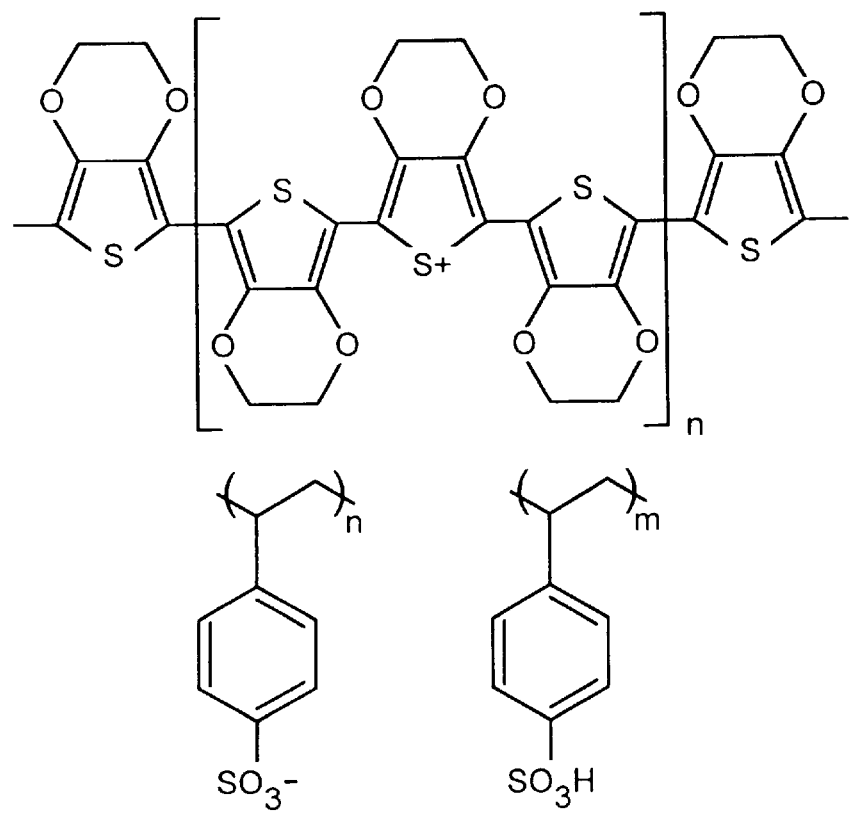
FIG. 2 shows the chemical formula of PEDT-PSS.

FIG. 1 shows an electroluminescent device having an anode layer 1 for injecting positive charge carriers, a conductive polymer layer 2, an organic light-emitting layer 3 and a cathode layer 4 for injecting negative charge carriers. The anode is patterned so as to comprise charge-injecting regions 5 (defining pixels) which are spaced from each other by gaps 6. The conductivity of the conductive polymer layer is selected so as to be low enough to allow for normal operation of the device (for instance, not so high that the drive voltage is increased significantly or that the efficiency or uniformity drops significantly) but high enough to resist cross-talk and lateral current-spreading between the charge-injecting regions and to resist off-pixel emission (so that the pixel edges are sharp and well-defined and there is no fuzzy emission edge to the pixels).

In more detail, the anode 1 is a layer of indium-tin oxide ("ITO") having a thickness of approximately 150 nm. The widths of the pixel regions 5 and the gaps 6 are around 50 μm.

The conductive polymer layer is a layer of PEDT-PSS with a thickness of around 50 nm and a conductivity of around $10^8$ Ohms/square. The layer also contains around 100 wt % epoxy-silane to produce cross-linking.

The light-emitting layer 3 is a layer of PPV having a thickness of 100 nm.

The cathode 4 is a layer of aluminium, having a thickness of 150 nm.

The relatively high resistance of the conductive polymer layer resists cross-talk between the charge-injecting regions 5, with lateral off-pixel emission being restricted to within 10 or 5% of the pixel dimension and/or leakage of current outside the pixel boundary being restricted to 5 or 10% of the total current through the addressed pixel. And surprisingly, it has been found that even at conductivities of the conductive polymer layer as low as $10^{10}$ Ohms/square the performance of the device is not necessarily impaired, the increase in drive voltage required being minimal.

A rough guide to the conductivity of the polymer layer that is required can be estimated with the aid of the following relationships:

for isotropic homogeneous conductivity media, the voltage drop across a device is given by:

$$V_d = j \perp R_\square t^2$$

j=current/area
t=thickness in units of area$^{-1}$
$R_\square$=sheet resistivity in $\Omega/\square$ whereas the current between the ITO lines is:

$$j_{\parallel} = (V\!A)/R_\square$$

A=aspect ratio of space between ITO lines

Clearly, the minimum advisable thickness of the polymer layer is dependent on the reliability of the process used to deposit the layer—if the layer is uneven and too thin in places then the anode and the light-emitting layer could make contact.

To produce the device, first the anode is deposited (on a glass substrate 7 for example) and patterned, e.g. by laser scribing, to define the charge-injecting and non-charge injecting regions. The charge injecting regions are connected individually to a control circuit so that they can be controlled independently and can thereby define pixel regions of the display, with each pixel region forming a column extending up from the corresponding charge injecting region.

A PEDT-PSS solution having a ratio of PEDT to PSS of 1:1.6 and a solid content of 1.2 to 1.3% is diluted further with extra PSS to achieve a PEDT to PSS ratio of 1:55 and a solid content of about 1%. Around 100 wt % epoxy-silane (specifically 3-glycide oxypropyltrimethoxysilane) is then added to the solution and the mixture is deposited on to the anode by spin coating. It is believed that both the PSS and the epoxy-silane act to reduce the conductivity of the resulting layer. The combination of PSS and epoxy-silane also helps to avoid problems with leakage currents in the pixels which have been experienced when epoxy-silane is used with lower concentrations of PSS. (Further information on this polymer system, which is available from Bayer AG, is given in Bayer's Provisional Product Information Sheet for Trial Product Al 4071).

After the PEDT-PSS layer has dried the layer of PPV is deposited on to the layer of PEDT-PSS by spin-coating from an aqueous solvent. This process is of itself well-known. It has been experienced that depositing a PPV precursor in this way on top of a layer of PEDT-PSS can dissolve the underlying PEDT-PSS layer, causing non-uniformities in, for instance, the thickness of the layer structure. This can result in non-uniform emission. It has been found that this problem is increased for higher concentrations of PSS in the PEDT-PSS layer, although higher concentrations of PSS can provide advantages in the device's current-voltage characteristics (e.g. less current leakage below the turn-on voltage and in reverse bias) and lifetime. Depositing PPV, over a PEDT-PSS layer has also been found to reduce the resistance of the PEDT-PSS layer. However, with epoxy-silane added to the PEDT-PSS layer the layer has been found to be structurally more stable, even at relatively high concentrations of PSS, avoiding the problems of intermixing with a PPV precursor and reduced resistance.

The cathode is then deposited by sputtering over the PPV layer, for instance by DC magnetron sputtering according to the following procedure. A target of Al95%/Li2.5%/Cu1.5%/Mg1% is used with sputtering in constant power mode at around 3.2 Wcm$^{-2}$ (100 mm diameter target and 250 W), pressure around $5 \times 10^{-3}$ mbar at 25 sccm argon flow (base pressure around $1 \times 10^{-6}$ mbar), target voltage 400–410V, target-substrate distance 75 mm and a deposition rate of around 1 nm/s. This tends to produce a metallic cathode of compact morphology with low average grain size and good adhesion to the adjacent organic layer.

When the device is in operation a voltage is applied across the electrodes and electrons and holes combine in the light emitting region to generate (via, it is believed, excitons) photons which are emitted through the ITO electrode and the glass layer. The recombination process is independent of the physical layering of the device.

Some alternative embodiments will now be described.

The light-emitting layer could be PPV (yellow/green) via the precursor route—as described above—or MEH-PPV (orange/red) which could be deposited from an organic solvent.

Other suitable polymers for the conductive polymer layer include polyaniline, polypyrrole and other poly-thiophenes than PEDT-PSS. In each case, suitable dopants and/or cross linking agents could be added to influence the polymer's properties.

The layer of conductive polymer could be deposited by a number of methods, including dip-coating, meniscus-coating, self-assembly or doctor-blade-coating.

Instead of the entire conductive polymer region being unpatterned, some parts of it could be unpatterned and some patterned.

The cathode could be a calcium cathode, deposited for instance by evaporation.

Some potential applications for the device are dot-matrix displays including passive matrix displays and active matrix addressed displays. In these devices, each charge-injecting region of the anode typically can selectively provide charge carriers to more than one pixel.

The present invention may include any feature or combination of features disclosed herein either implicitly or explicitly or any generalisation thereof irrespective of whether it relates to the presently claimed invention. In view of the foregoing description it will be evident to a person skilled in the art that various modifications may be made within the scope of the invention.

We claim:

1. An electroluminescent device comprising:
    a first charge-carrier injecting layer for injecting positive charge carriers and a second charge-carrier injecting layer for injecting negative charge carriers, at least one of the charge-carrier injecting layers being patterned so as to comprise spaced-apart charge-injecting regions;
    an organic light-emitting layer located between the first and second charge-carrier injecting layers; and
    an unpatterned conductive polymer layer located between the organic light-emitting layer and the patterned charge-carrier injecting layer, the resistivity of the conductive polymer layer being sufficiently low to allow charge carriers to flow through it from the charge-injecting regions to generate light in the organic light-emitting layer but sufficiently high to resist lateral spreading of charge carriers beyond the charge-injecting regions.

2. An electroluminescent device as claimed in claim 1, wherein the light-emitting layer comprises a light-emitting conductive polymer.

3. An electroluminescent device as claimed in claim 1, wherein the light-emitting layer comprises a semiconductive conjugated polymer.

4. An electroluminescent device as claimed in claim 1, wherein the conductive polymer layer comprises polyaniline, polypyrrole or a poly-thiophene.

5. An electroluminescent device as claimed in claim 1, wherein the conductive polymer layer comprises polyethylene dioxythiophene.

6. An electroluminescent device as claimed in claim 1, wherein the conductive polymer layer comprises a dopant, the presence of which affects the resistivity of the conductive polymer layer.

7. An electroluminescent device as claimed in claim 6, wherein the dopant is polystyrene sulphonic acid.

8. An electroluminescent device as claimed in claim 6, wherein the conductive polymer layer contains greater than 50% dopant.

9. An electroluminescent device as claimed in claim 1, wherein the conductive polymer layer comprises a component which reduces the solubility of the layer.

10. An electroluminescent device as claimed in claim 8, wherein the component is epoxy-silane.

11. An electroluminescent device as claimed in claim 9, wherein the conductive polymer layer contains greater than 50 wt % of the component.

12. An electroluminescent device as claimed in claim 1, wherein the sheet resistance of the conductive polymer layer is greater than $10^6$ Ohms/square.

13. An electroluminescent device as claimed in claim 1, wherein the regions of the light emitting layer capable of emitting light in use do not extend laterally beyond the charge injecting regions by more than 10% of the width of the charge injecting regions.

14. An electroluminescent device as claimed in claim 1, wherein each charge-injecting region defines one or more pixel regions of the device.

15. An electroluminescent device as claimed in claim 1, wherein each charge-injecting region is independent of the other charge-injecting region.

16. An electroluminescent device as claimed in claim 1, wherein the first charge-carrier injecting layer is the patterned charge-carrier injecting layer.

* * * * *